US007333901B2

(12) United States Patent
Nikkuni

(10) Patent No.: US 7,333,901 B2
(45) Date of Patent: Feb. 19, 2008

(54) TRANSMITTER SYSTEM

(75) Inventor: Masaaki Nikkuni, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 11/080,623

(22) Filed: Mar. 16, 2005

(65) Prior Publication Data

US 2005/0216217 A1 Sep. 29, 2005

(30) Foreign Application Priority Data

Mar. 23, 2004 (JP) ............................ 2004-083907

(51) Int. Cl.
*G01R 21/00* (2006.01)

(52) U.S. Cl. ........................................................ 702/62

(58) Field of Classification Search .................. 702/62, 702/60, 61, 64

See application file for complete search history.

(56) References Cited

U.S. PATENT DOCUMENTS 4,841,296 A * 6/1989 Kadoya et al. ........ 340/870.16
5,677,476 A * 10/1997 McCarthy et al. ......... 73/29.01
6,480,131 B1 * 11/2002 Roper et al. ................ 341/155
6,665,620 B1 * 12/2003 Burns et al. .................. 702/62
2004/0107779 A1 * 6/2004 Kishimoto et al. ...... 73/861.29

FOREIGN PATENT DOCUMENTS

JP 2644742 5/1997

* cited by examiner

*Primary Examiner*—John Barlow
*Assistant Examiner*—Aditya Bhat
(74) *Attorney, Agent, or Firm*—Westerman, Hattori, Daniels & Adrian, LLP.

(57) ABSTRACT

The present invention intends to provide a small, low-cost, convenient transmitter system. The transmitter system detects physical quantities, converts the physical quantities into electrical signals, and allows the electrical signals to be transmitted to a load through a transmission line, comprising a main output circuit to be connected to a main instrumentation power supply and at least one subordinate output circuit to be connected to a subordinate instrumentation power supply.

4 Claims, 5 Drawing Sheets

TRANSMITTER SYSTEM

BACKGROUND OF THE INVENTION

1. Field of the Invention

The present invention relates to a transmitter system that detects physical quantities, converts the physical quantities into electrical signals, and allows the signals to be transmitted to a load through a transmission line. More particularly, the invention relates to a transmitter system that generates a 4-20 mA two-wire standardized current output.

2. Description of the Prior Art

FIG. 1 is a schematic view illustrating the configuration of a conventional transmitter system. In the figure, transmitter 10 is formed according to a two-wire method and is connected to transmission line 19.

Transmission line 19 is connected to a series circuit of instrumentation power supply E1 and load R1. Terminal 12 is connected across load R1. Load R1 is assumed to be, for example, 250 Ω.

In the example of the conventional transmitter system configured as discussed above and illustrated in FIG. 1, the output of transmitter 10 is a voltage change in load R1 and the change is sent to terminal 12.

FIG. 2 is a block diagram illustrating the configuration of a conventional transmitter and the configuration is described hereinafter.

Sensor 21 detects physical quantities, for example, differential pressure, static pressure, capsule temperature and amplifier temperature.

Conversion block 22 is connected to sensor 21 and converts the output thereof into electrical signals. In addition, conversion block 22 is internally equipped with a switching means (not shown in the figure) for selecting differential pressure, static pressure or temperature.

Microprocessor (MPU) 23 is connected to conversion block 22 and performs such tasks as corrective calculation and communication for the output of the conversion block.

Gate array (G/A) 24 is connected to MPU 23 and performs pulse width modulation (PWM) on the output of MPU 23.

Digital-to-analog conversion block (D/A conversion block) 25 is connected to G/A 24 and generates a 4-20 mA two-wire standardized current output according to electrical signal PWM1 from G/A 24 and sends the output to instrumentation power supply E1.

Shunt regulator 26 is supplied with power from instrumentation power supply E1 and supplies voltage V1 to conversion block 22, series regulator 27, D/A conversion block 25, and so on. Voltage V1 is assumed to be, for example, 5 V.

Series regulator 27 is supplied with power from shunt regulator 26 and supplies voltage V2 to MPU 23, G/A 24, and so on. Voltage V2 is assumed to be, for example, 3 V. In addition, series regulator 27 is equipped with zener diode D3 whose zener voltage is 2.5 V.

Now, an explanation will be made to how the example of the conventional transmitter system illustrated in FIG. 2 operates.

First, in order to measure differential pressure, the switching means within conversion block 22 selects the option "differential pressure." The differential pressure to be measured is detected by sensor 21, converted into an electrical signal by conversion block 22, calculated correctively and communicated by MPU 23, pulse-modulated by G/A 24, converted into a 4-20 mA two-wire standardized current output by D/A conversion block 25, and sent to instrumentation power supply E1.

Second, in order to measure static pressure, the switching means within conversion block 22 selects the option "static pressure." The static pressure to be measured is detected by sensor 21, converted into an electrical signal by conversion block 22, calculated correctively and communicated by MPU 23, pulse-modulated by G/A 24, converted into a 4-20 mA two-wire standardized current output by D/A conversion block 25, and sent to instrumentation power supply E1.

Likewise, in order to measure temperature, the switching means within conversion block 22 selects the option "temperature." In this way, the transmitter selects from the options "differential pressure," "static pressure," "temperature" and so on according to the object of measurement, and outputs their values.

Some conventional transmitters are designed to optionally select from differential pressure, static pressure and temperature signals (see patent document 1, for example).

Patent document 1: Patent gazette 2644742

However, in order to simultaneously transmit differential pressure, static pressure, temperature and other physical quantities using the example of the conventional transmitter system or transmitter illustrated in FIG. 1 or FIG. 2, it is necessary to configure a transmitter system by combining two or more transmitters. As a result, the problem is that the system becomes large and expensive.

SUMMARY OF THE INVENTION

The present invention is intended to solve the aforementioned problem. An object of the invention, therefore, is to provide a small, low-cost transmitter system. Another object of the present invention is to provide a convenient transmitter system.

The transmitter system in accordance with the present invention, in which the aforementioned objects are achieved, is as follows:

(1) A transmitter system that detects physical quantities, converts the physical quantities into electrical signals, and allows the electrical signals to be transmitted to a load through a transmission line, comprising:
  - a main output circuit to be connected to a main instrumentation power supply; and
  - at least one subordinate output circuit to be connected to a subordinate instrumentation power supply.

(2) The transmitter system of item 1, wherein the subordinate output circuit comprises:
  - a power supply circuit which is supplied with power from the subordinate instrumentation power supply; and
  - a D/A conversion block which is supplied with power from the power supply circuit and generates an output according to the electrical signals.

(3) The transmitter system of item 2, wherein the D/A conversion block generates a 4-20 mA two-wire standardized current output.

(4) The transmitter system of item 1, 2 or 3, wherein the main output circuit has a communication function and the subordinate output circuit performs zero-point adjustment, span adjustment or the like, according to a command from the communication function.

DETAILED DESCRIPTION OF THE PREFERRED EMBODIMENTS

Figure 3A:
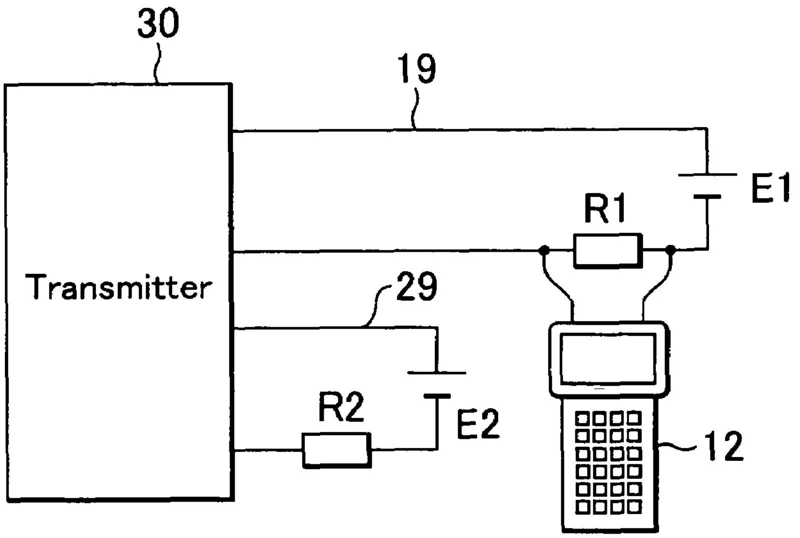
FIG. 3 is a schematic view illustrating one embodiment of a transmitter system in accordance with the present invention.
Figure 3B:
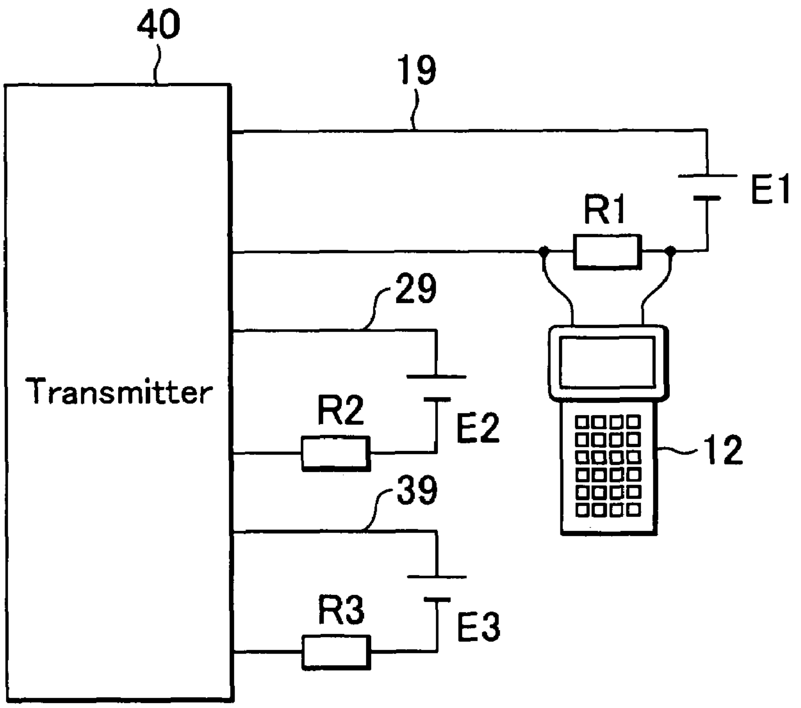

The present invention will hereinafter be described in detail with reference to FIG. 3, wherein FIG. 3 is a schematic view illustrating one embodiment of a transmitter system in accordance with the present invention. In the figure, like components are denoted by like numerals as in the first embodiment and will not be explained further.

The embodiment illustrated in FIG. 3 is characteristic in that the transmitter system comprises a main output circuit to be connected to instrumentation power supply E1 which is a main instrumentation power supply, and a subordinate output circuit to be connected to instrumentation power supply E2 which is a subordinate instrumentation power supply other than instrumentation power supply E1.

FIG. 3(*a*) illustrates the case when the transmitter system has only one subordinate output circuit, whereas FIG. 3(*b*) illustrates the case when the transmitter system has two subordinate output circuits. More particularly, the transmitter system illustrated in FIG. 3(*b*) comprises a first subordinate output circuit to be connected to first subordinate instrumentation power supply E2 and a second subordinate output circuit to be connected to second subordinate instrumentation power supply E3.

In the embodiment illustrated in FIG. 3 and discussed above, it is possible to provide outputs through multiple channels with just one transmitter. Consequently, differential pressure, static pressure, temperature and other physical quantities can be transmitted using only one transmitter.

Figure 4:
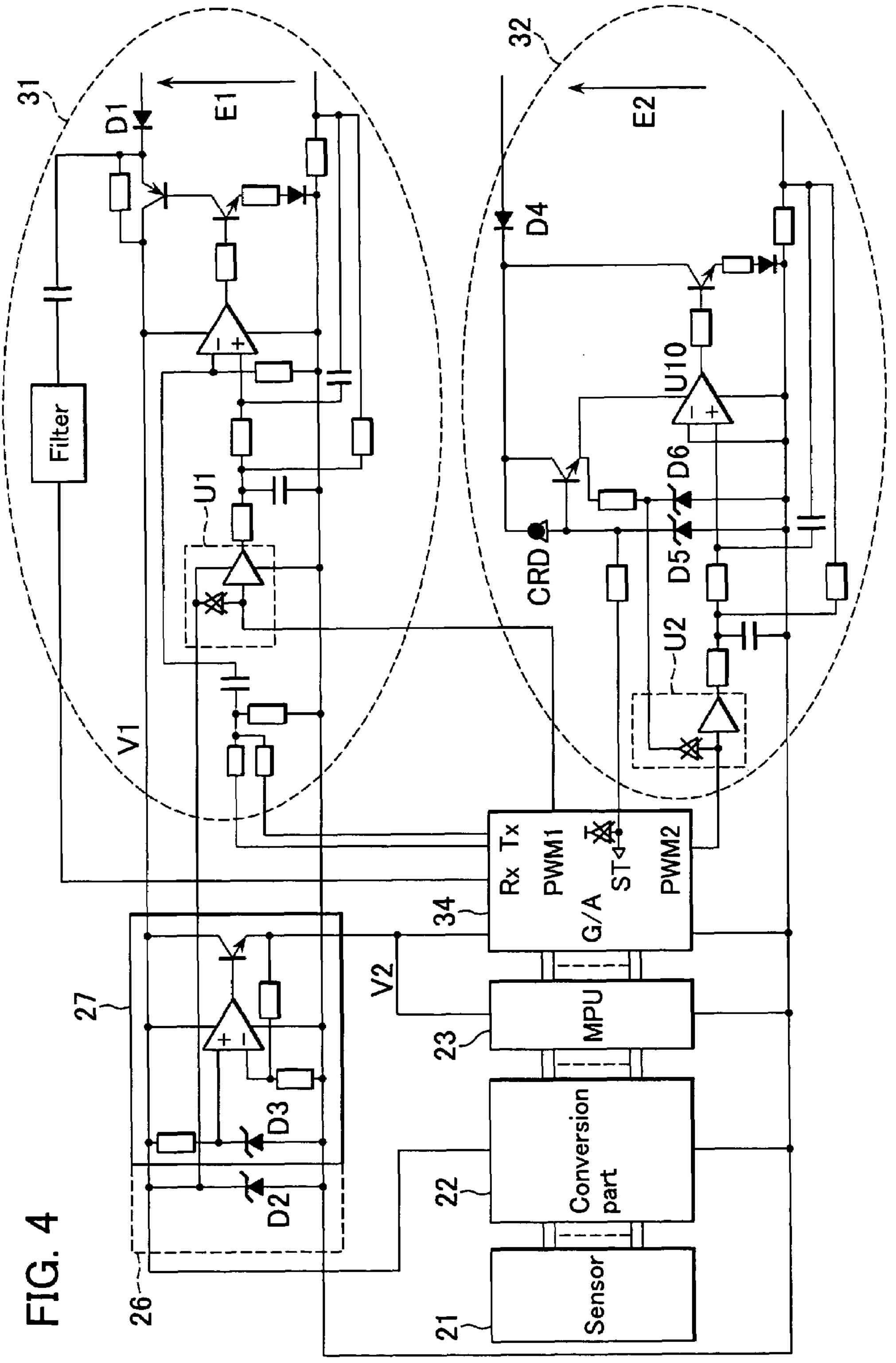
FIG. 4 is a block diagram illustrating the configuration of one embodiment of a transmitter in accordance with the present invention.

The present invention will hereinafter be described in detail with reference to FIG. 4, wherein FIG. 4 is a block diagram illustrating the configuration of one embodiment of a transmitter in accordance with the present invention.

Figure 1:
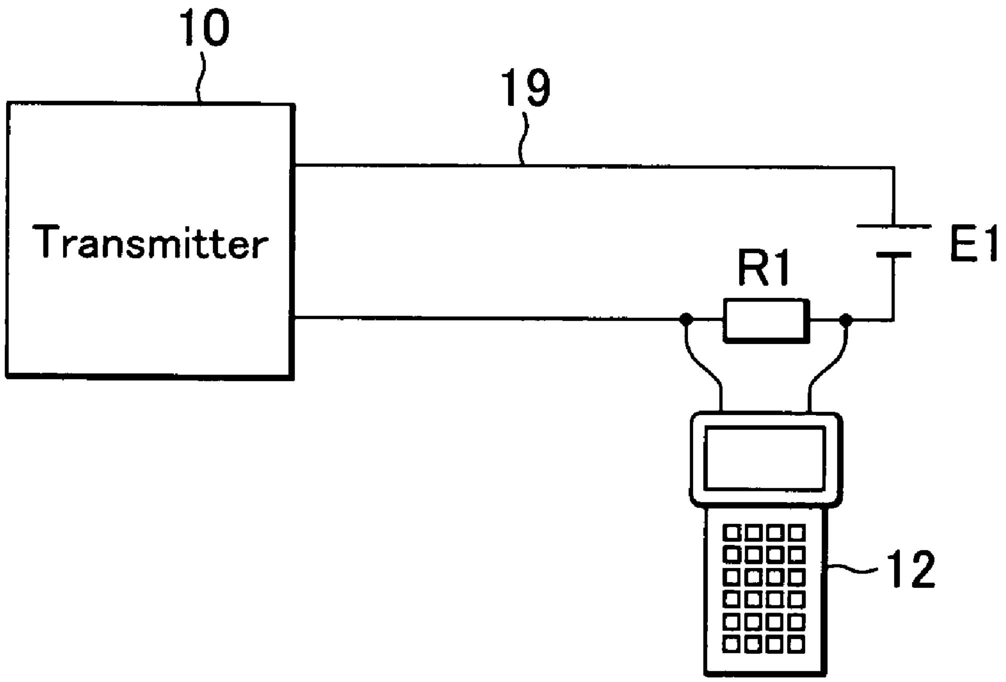
FIG. 1 Prior Art
FIG. 1 is a schematic view illustrating the configuration of a conventional transmitter system.
Figure 2:
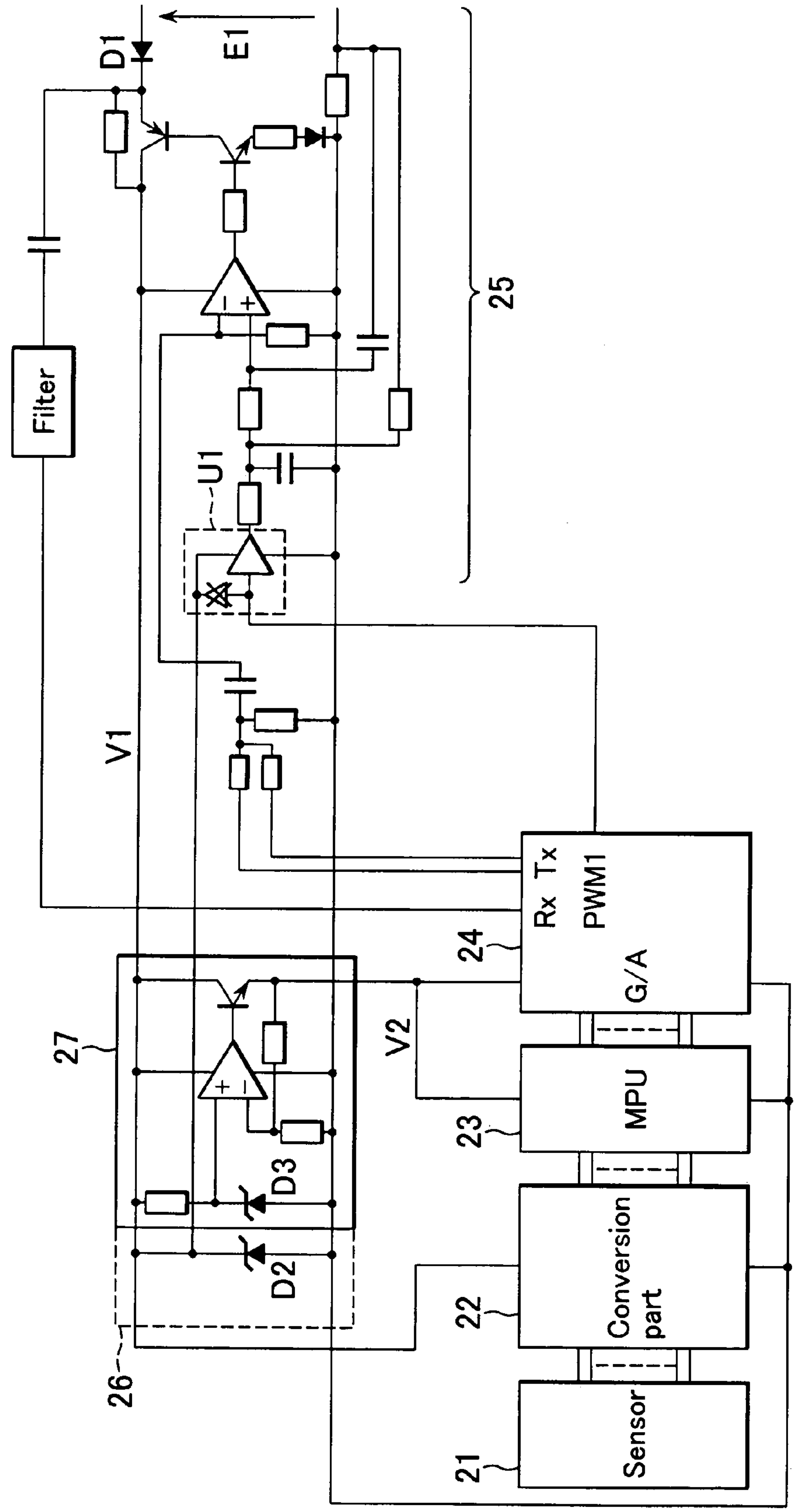
FIG. 2 Prior Art
FIG. 2 is a block diagram illustrating the configuration of a conventional transmitter.

In the figure, like components are denoted by like numerals as in the embodiment illustrated in FIG. 2 and will not be explained further.

The embodiment illustrated in FIG. 4 is characteristic in that the transmitter comprises first output circuit 31 which is a main output circuit, and second output circuit 32 which is a subordinate output circuit.

The configuration of the embodiment illustrated in FIG. 4 will hereafter be described.

G/A 34 is connected to MPU 23 and performs pulse-width modulation (PWM) on the output of MPU 23.

First output circuit 31, which is the main output circuit, is connected to G/A 34. This first output circuit generates a 4-20 mA two-wire standardized current output according to electrical signal PWM1 from G/A 34 and sends the output to instrumentation power supply E1.

First output circuit 31 in the embodiment illustrated in FIG. 4 has a configuration corresponding to that of D/A conversion block 25 in the example of the conventional transmitter illustrated in FIG. 2 and a communication function (not shown in the figure). The communication function of first output circuit 31 performs zero-point adjustment, span adjustment or the like on the side of second output circuit 32 according to commands from the outside.

Second output circuit 32, which is a subordinate output circuit, is connected to G/A 34. This second output circuit generates a 4-20 mA two-wire standardized current output according to electrical signal PWM2 from G/A 34 and sends the output to instrumentation power supply E2.

Second output circuit 32 has a circuit configuration equivalent to the D/A conversion block of first output circuit 31 and a shunt regulator comprising constant-current diode CRD and zener D5. In addition, output operational amplifier U10 and zener diode D6, which is a reference power supply of the D/A conversion block, are connected to this shunt regulator.

The zener voltages of zener diodes D5 and D6 are assumed to be, for example, 6.2 V and 2.5 V, respectively.

The shunt regulator is supplied with power from instrumentation power supply E2.

Now an explanation will be made as to how the embodiment illustrated in FIG. 4 operates.

The differential pressure to be measured, for example, is detected by sensor 21, converted into an electrical signal by conversion block 22, and calculated correctively and communicated by MPU 23, pulse-modulated by G/A 34, converted into a 4-20 mA two-wire standardized current output by first output circuit 31, and output to instrumentation power supply E1.

The static pressure to be measured, for example, is detected by sensor 21, converted into an electrical signal by conversion block 22, and calculated correctively and communicated by MPU 23, pulse-modulated by G/A 34, converted into a 4-20 mA two-wire standardized current output by second output circuit 32, and output to instrumentation power supply E2.

Consequently, the embodiment illustrated in FIG. 4 can simultaneously transmit both differential pressure and static pressure, for example, with just one transmitter. It is also possible to show static pressure or differential pressure on the display means (not shown in the figure) of the embodiment illustrated in FIG. 4.

Since electrical power consumed by second output circuit 32 is not supplied from instrumentation power supply E1, no mutual interference occurs between the operation of first output circuit 31 and that of second output circuit 32.

First output circuit 31 of the embodiment illustrated in FIG. 4 is equivalent to D/A conversion block 25 of the embodiment illustrated in FIG. 2 in terms of circuit configuration. The start-up sequence and respective functions in the embodiment illustrated in FIG. 4 are the same as those of the example of the conventional transmitter illustrated in FIG. 2.

For this reason, the embodiment illustrated in FIG. 4 is more convenient than the conventional transmitter.

Now an explanation will be made in further detail as to how the embodiment illustrated in FIG. 4 operates.

A step is executed in which constant-current diode CRD is activated by instrumentation power supply E2. Then, another step is executed in which zener diode D5 is activated. Next, yet another step is executed in which output operational amplifier U10 and zener diode D6 are activated.

The operating condition of first output circuit 31 does do not change even if a step is executed with instrumentation power supply E1 being applied in which instrumentation power supply E2 turns off.

The operating condition of first output circuit 31 does not change either even if a step is executed next in which instrumentation power supply E2 turns on again.

Using the communication function of first output circuit 31, the settings of first output circuit 31 and second output circuit 32 can be defined in detail. For example, these circuits can be set so that one of them overshoots to the upper limit and the other overshoots to the lower limit if an error occurs. In other words, it is possible to independently define the settings of first output circuit 31 and second output circuit 32.

Figure 5:
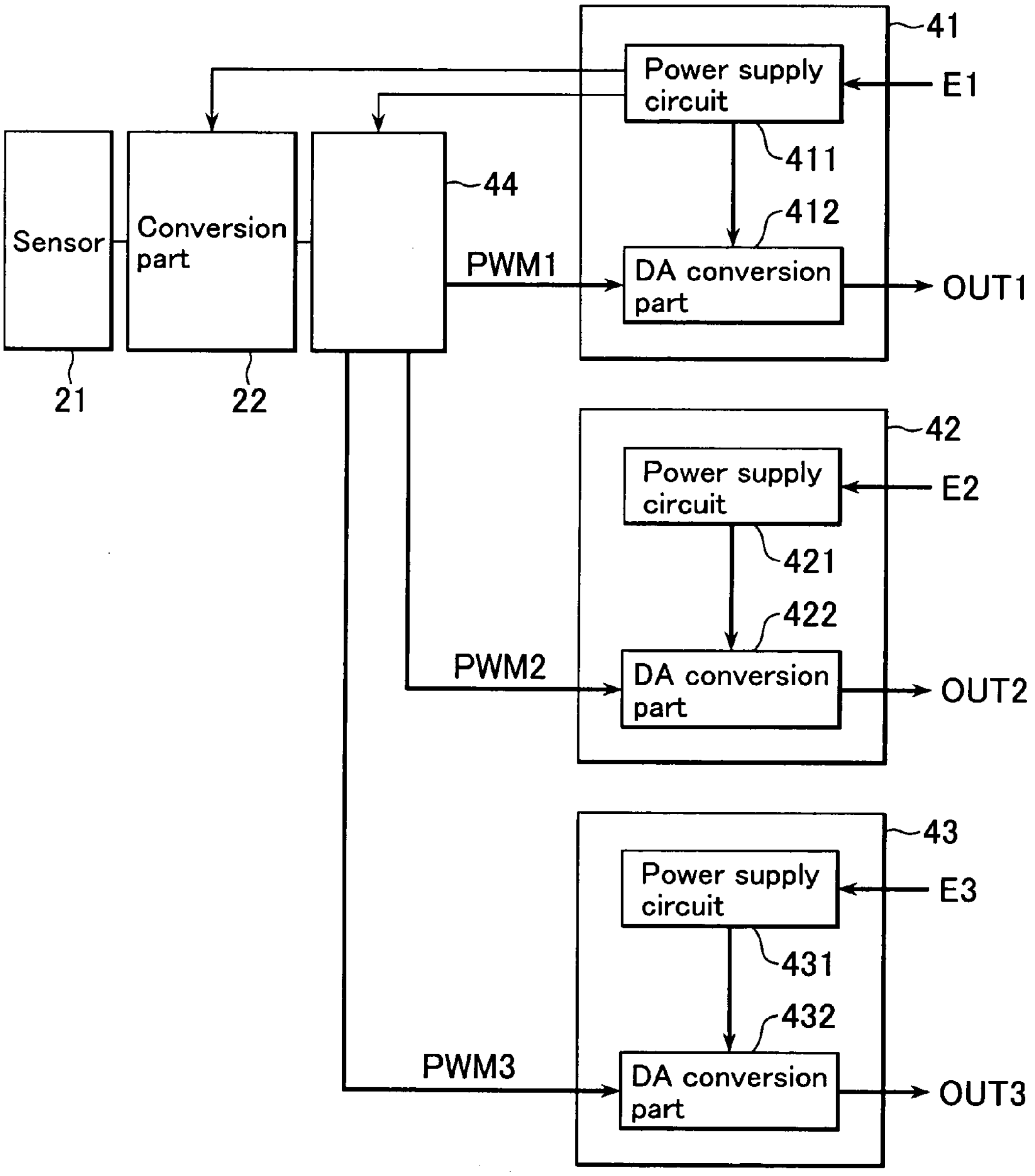
FIG. 5 is a block diagram illustrating the configuration of another embodiment of the transmitter in accordance with the present invention.

Now the present invention will hereinafter be described in detail with reference to FIG. 5, wherein FIG. 5 is a block diagram illustrating the configuration of another embodiment of the transmitter in accordance with the present invention. In the figure, like components are denoted by like numerals as in the embodiment illustrated in FIG. 3 and will not be explained further.

The embodiment illustrated in FIG. 5 is characteristic in that it comprises power supply circuits 411, 421 and 431 and D/A conversion blocks 412, 422 and 432.

In the figure, digital circuit 44 of the embodiment illustrated in FIG. 5 corresponds to MPU 23 and G/A 34 of the embodiment illustrated in FIG. 4.

First output circuit 41, which is the main output circuit, is connected to digital circuit 44 and comprises power supply circuit 411 which is supplied with power from main instrumentation power supply E1. In addition, first output circuit 41 is supplied with power from power supply circuit 411 and comprises D/A conversion block 412 that generates output OUT1 according to electrical signal PWM1 from digital circuit 44.

Power supply circuit 411 also supplies power to conversion block 22 and digital circuit 44.

Second output circuit 42, which is the first subordinate output circuit, is connected to digital circuit 44 and comprises power supply circuit 421 which is supplied with power from subordinate instrumentation power supply E2. In addition, second output circuit 42 is supplied with power from power supply circuit 421 and comprises D/A conversion block 422 which generates output OUT2 according to electrical signal PWM2 from digital circuit 44.

Third output circuit 43, which is the second subordinate output circuit, is connected to digital circuit 44, and comprises power supply circuit 431 which is supplied with power from subordinate instrumentation power supply E3. In addition, third output circuit 43 is supplied with power from power supply circuit 431 and comprises D/A conversion block 432 which generates output OUT3 according to electrical signal PWM3 from digital circuit 44.

The embodiment illustrated in FIG. 5 and discussed above shares virtually the same configuration with the embodiment illustrated in FIG. 4 and has the same working and effect as those of the embodiment illustrated in FIG. 4.

Consequently, in the embodiment illustrated in FIG. 5, a plurality of physical quantities are detected with the single transmitter and converted into electrical signals and these electrical signals are simultaneously transmitted to the load through the transmission line.

Since the amount of power consumed by first output circuit 41 is kept constant irrespective of the presence or absence of second output circuit 42 and third output circuit 43, the embodiment illustrated in FIG. 5 has the electrical characteristics which are convenient and preferable for increasing the number of outputs.

As an alternative to the above-discussed embodiment, which is a three-output transmitter, a transmitter having four or more outputs can be embodied to obtain the same working and effect as those of the three-output transmitter.

As another alternative to the above-discussed embodiment, which is a 4-20 mA current-output transmitter, a 1-5V voltage-output transmitter can be embodied to obtain the same working and effect as those of the current-output transmitter.

Furthermore, the present invention is not limited to differential pressure transmitters but can be applied to all sorts of transmitters to provide the same working and effect as those of the embodiments discussed herein.

It is to be understood therefore that the present invention is not restricted to the foregoing embodiments; rather, many other alterations and modifications thereof may be made without departing from the spirit and essential characteristics thereof.

As described above, the following advantageous effects are achieved according to the present invention:

According to the present invention, it is possible to provide a small-size, low-cost transmitter, as well as a convenient transmitter system.

According to the present invention, it is also possible to detect a plurality of physical quantities with a single transmitter, convert the physical quantities into electrical signals, and simultaneously transmit the electrical signals to a load.

What is claimed is:

1. A transmitter system that detects a plurality of physical quantities, converts said physical quantities into a plurality of electrical signals, and allows said electrical signals to be transmitted to a load through a transmission line, comprising:

a main output circuit to be connected to a main instrumentation power supply; and at least one subordinate output circuit to be connected to a subordinate instrumentation power supply, wherein the supply of electrical power from the main instrumentation power supply is independent of that of the subordinate instrumentation power supply, such that said output circuits transmit said electrical signals converted from said physical quantities simultaneously, and wherein said subordinate output circuit comprises:

(a) a power supply circuit which is supplied with power from said subordinate instrumentation power supply; and (b) a D/A conversion block which is supplied with power from said power supply circuit and generates an output according to said electrical signals.

2. The transmitter system of claim 1, wherein said D/A conversion block generates a 4-20 mA two-wire standardized current output.

3. The transmitter system of claim 2, wherein said main output circuit has a communication function and said subordinate output circuit performs zero-point adjustment, span adjustment, according to a command from said communication function.

4. The transmitter system of claim 1, wherein said main output circuit has a communication function and said subordinate output circuit performs zero-point adjustment, span adjustment, according to a command from said communication function.

* * * * *